United States Patent [19]

Kurosawa et al.

[11] 4,407,851

[45] Oct. 4, 1983

[54] METHOD FOR MANUFACTURING SEMICONDUCTOR DEVICE

[75] Inventors: Kei Kurosawa, Tokyo; Tadashi Shibata, Yokohama, both of Japan

[73] Assignee: Tokyo Shibaura Denki Kabushiki Kaisha, Japan

[21] Appl. No.: 335,714

[22] Filed: Dec. 29, 1981

[30] Foreign Application Priority Data

Apr. 13, 1981 [JP] Japan .................................. 56/55450
Jun. 10, 1981 [JP] Japan .................................. 56/88254

[51] Int. Cl.³ .......................................... H01L 21/76
[52] U.S. Cl. ...................................... 427/39; 148/1.5; 156/643; 156/649; 156/653; 156/657; 156/659.1; 204/192 D; 427/85; 427/93; 427/94; 427/95; 427/96; 427/259
[58] Field of Search ............... 156/653, 649, 657, 643, 156/659.1; 427/96, 39, 85, 93–95, 259; 148/1.5; 204/192 D

[56] References Cited

U.S. PATENT DOCUMENTS 4,305,974 12/1981 Abe ........................................ 427/96
4,321,284 3/1982 Yakushiji ............................. 427/96
4,328,263 5/1982 Kurahashi ............................ 427/88
4,333,965 6/1982 Chow ................................... 156/649

FOREIGN PATENT DOCUMENTS 56-24370 6/1981 Japan .

OTHER PUBLICATIONS

Adams et al., "Characterization of Plasma-Deposited Silicon Dioxide," J. Electrochem. Soc.: Solid-State Science and Technology, Jul. 1981, pp. 1545–1551.
Yokoyama et al., "Characterization of Plasma-Deposited Silicon Nitride Films", Journal Applied Physics, vol. 51, No. 10, Oct. 1981, pp. 5470–5474.
Dun et al., "Mechanisms of Plasma-Enhanced Silicon Nitride Deposition using $SiH_4/N_2$ Mixture," J. Electrochem Society: Solid-State Science and Technology, Jul. 1981, pp. 1555–1563.
Keller et al., "Sputtering Process Model of Deposition Rate," IBM Journal Research Development, Vol. 21, No. 1, Jan. 1979, pp. 25–32.
Szendro et al., "Low Pressure Deposition of Silicon Nitride . . .", Tungsram, H-1340, Budapest, Hungary, vol. 128, No. 3.

*Primary Examiner*—John D. Smith
*Attorney, Agent, or Firm*—Finnegan, Henderson, Farabow, Garrett & Dunner

[57] ABSTRACT

A method of forming a flat field region in a semiconductor substrate, which comprises forming a recess in the substrate, forming a covering on the whole surface of the substrate with a first insulating film such as plasma CVD $SiO_2$ film which gives a layer at the side portion of the recess more rapidly etchable as compared with other portions, selectively removing the layer at the side portion to thereby form a V-shaped groove between the side of the recess and the first insulating film, and filling the V-shaped groove with a second insulating material so as to obtain a flat field region which is flush with the surface of an element-forming region.

6 Claims, 3 Drawing Figures

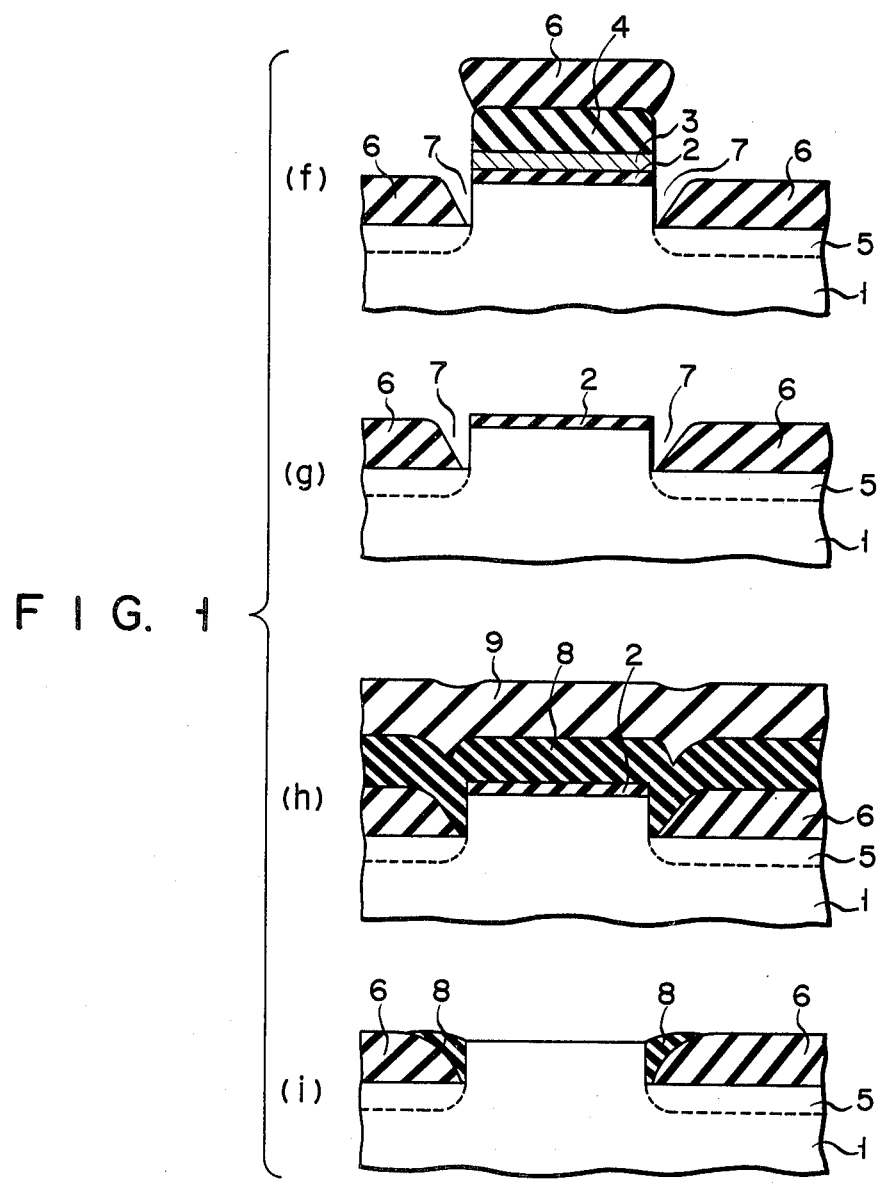
F I G. 1

METHOD FOR MANUFACTURING SEMICONDUCTOR DEVICE

BACKGROUND OF THE INVENTION

The present invention relates to a method for manufacturing a semiconductor device wherein an insulating film is formed in a field region for element isolation.

In a semiconductor device using silicon for semiconductors, especially in a MOS semiconductor integrated circuit, a thick insulating film is formed in the field region between the elements in order to prevent unsatisfactory isolation due to parasitic channels and to reduce the parasitic capacitance to the minimum. Selective oxidation is well known as a method for element isolation. According to this selective oxidation method, the element forming region is covered with an antioxidant mask, typically, a silicon nitride film. Then, oxidation is performed at a high temperature to selectively form a thick oxide film on the field region. However, with this selective oxidation method, during the oxidation at high temperature, the field oxide film undercuts the edge of the silicon nitride film in the form of a bird's beak. This causes a size error in the element forming region and interferes with high integration of integrated circuits. Furthermore, in the conventional selective oxidation method, a step of about half the thickness (about 0.7 to 1.0μ) of the field oxide film is formed in the field region and the element forming region after the formation of the field oxide film. This step remains in the following process and results in the degradation in the precision of lithography and the reliability of the metal wiring. The conventional selective oxidation method further involves a long field oxidation time. This results in various problems such as undesirable diffusion of impurities from the channel stopper, or formation of defective crystals such as dislocation in the silicon substrate which is caused by the stresses due to the growth of the oxide film, as well as due to a difference in thermal expansion coefficient between the silicon nitride film and the silicon substrate.

In order to avoid the defects as described above involved in the element isolation method by the selective oxidation, a method is disclosed in Japanese Patent Publication (KOKAI) No. 11,792/75, wherein a mask is formed on a semiconductor substrate, a groove of predetermined depth is formed in the substrate by etching, an insulating film is formed on the entire surface of the structure by the CVD process to a thickness sufficient to fill the groove, and the mask is then removed by etching to simultaneously remove the insulating film on the mask while leaving the insulating film in the groove only to provide it as an element isolation layer. According to this method, the process may be performed at a relatively low temperature, the adverse effects such as thermal distortion of the substrate may be reduced to the minimum, the formation of the bird's beaks is restricted, and the lateral diffusion of the impurity layer of the channel stopper may be prevented. However, a recess may be formed between the side walls of the groove and the side surfaces of the remaining insulating film. A void may be formed within the remaining insulating film. The formation of such a void become more prominent when the depth of the groove is relatively large in comparison with the width of the groove, for example, when the depth of the groove is more than twice the width.

SUMMARY OF THE INVENTION

The present invention has been made to eliminate the drawbacks of the element isolation method as described above and has for its object to provide a method for manufacturing a semiconductor device wherein the element isolation may be accomplished by one lithographic step, the thermal oxidation step at high temperature for a long period of time is not required, the groove for a field region may be completely filled with an insulating film, the surface of the substrate may be made even, the element characteristics may not be degraded, and small elements may be highly integrated.

In order to achieve this object, there is provided according to an aspect of the present invention a method for manufacturing a semiconductor device comprising the steps of:

(a) forming a masking material at a predetermined part of a surface of a semiconductor substrate, and etching said semiconductor substrate using said masking material as a mask to form a recess;

(b) covering by a first insulating film the surface of said semiconductor substrate under such conditions that said masking material is still disposed, said first insulating film comprising an insulating film in which an etching rate at a side surface at a step may be greater than an etching rate at other parts, such as a plasma CVD $SiO_2$ film, a plasma CVD $Si_3N_4$ film, a sputtered $SiO_2$ film or a low-pressure CVD phosphosilicate glass film;

(c) etching said first insulating film to selectively remove said first insulating film covering the side surface of said recess to thereby form a V-shaped groove between the side surface of said recess and said first insulating film remaining in said recess;

(d) simultaneously removing said masking material and said first insulating film formed thereover;

(e) forming a second insulating film on an upper surface of said semiconductor substrate including said V-shaped groove formed in said step (c) in such a way that an upper surface thereof may become even; and (f) etching the upper surface of said second insulating film to leave said first and second insulating films in said recess.

According to another aspect of the present invention is provided a method for manufacturing a semiconductor device comprising the steps of:

(a) forming a masking material at a predetermined part of a surface of a semiconductor substrate, and etching said semiconductor substrate using said masking material as a mask to form a recess;

(b) covering by a first insulating film the surface of said semiconductor substrate under such conditions that said masking material is still disposed, said first insulating film comprising an insulating film in which an etching rate at a side surface at a step may be greater than an etching rate at other parts, such as a plasma CVD $SiO_2$ film, a plasma CVD $Si_3N_4$ film, a sputtered $SiO_2$ film or a low-pressure CVD phosphosilicate glass film;

(c) etching said first insulating film to selectively remove said first insulating film covering the side surface of said recess to thereby form a V-shaped groove between the side surface of said recess and said first insulating film remaining in said recess;

(d) simultaneously removing said masking material and said first insulating film formed thereover;

(d') thermally oxidizing an exposed part of the surface of said semiconductor substrate at least on an inner surface of said V-shaped groove to form a thermal oxide film thereon;

(e) forming a second insulating film on an upper surface of said semiconductor substrate including said V-shaped groove formed in said step (c) in such a way that an upper surface thereof may become even; and (f) etching the upper surface of said second insulating film to leave said first and second insulating films in said recess.

In step (a) described above, the masking material may include known resist materials, such as aluminum, silicon nitride, a bilayered structure of SiO₂ and polycrystalline silicon, a bilayered structure of Al and SiO₂, or a multi-layered structure of Al-silicon nitride-SiO₂. The recess may be formed by reactive ion etching, conventional taper etching or the like.

After step (a) described above, an impurity for preventing field inversion may be implanted in the region below the recess using the masking material as a mask. This implantation of the impurity may be performed after the step for forming the insulating films.

By the V-shaped groove formed in step (c) or referred in this specification, it should be understood to include any grooves having at least one tapered side surface opening upward. The shape of the bottom of the groove is not particularly limited and may be pointed or flat.

The second insulating film formed in step (e) may be a CVD SiO₂ film, a spin coat SiO₂ film, a resist material film, a low-melting point insulating substance (e.g., boron phosphosilicate glass; BPSG). In the case of a p-channel MOS, the second insulating film may be a phoshosilicate glass (PSG) film, an arsenic silicate glass (AsSG) or the like. Alternatively, the second insulating film may be made of the same material as that of the first insulating film. Furthermore, the second insulating film may comprise a single layer or a multilayer.

According to the method of the present invention, an inversion preventive layer and a thick field insulating film may be formed in the field region by one lithographic process as in the case of the conventional selective oxidation method. Furthermore, the undercutting (formation of a bird's beak) of the field oxide film or size error of the element forming region that are caused in the conventional selective oxidation method may be prevented. The size error of the element forming region may be suppressed to below 0.1 μm, and high integration may be achieved.

In addition to this, the annealing step at high temperature for a long time is not necessary to form the field insulating film. For this reason, the seepage of the impurity outside the field region due to redistribution of the impurity is prevented, so that degradation in the element characteristics is prevented and higher integration may be achieved. Since the dose of the impurity implanted at the side surface of the recess of the field region during the field ion-implantation is smaller than the dose of the impurity which is implanted at the bottom surface of the recess, diffusion of the impurity into the semiconductor substrate below the element forming region may be significantly reduced, and thus, the degradation of the element characteristics as well.

The method of the present invention utilizes a peculiar etching rate at the side surface of a step portion of the first insulating film at the recess which is faster than the etching rate at the other parts, due to a relatively fragile deposition of the first insulating film at the side surface of the step portion. Therefore, when etching is performed, the side surface of the first insulating film remaining in the recess is formed into a tapered surface of suitable inclination (e.g., less than 80° with respect to the bottom surface of the recess). When the second insulating film is to be formed in a V-shaped groove defined between the side surface of the recess and the first insulating film, the V-shaped groove may be easily and properly filled with the second insulating film.

In this manner, according to the present invention, the insulating film completely fills the field region, so that the step around the field region may be suppressed to be less than 0.1 μm in thickness. For this reason, formation of too thin metal wiring or disconnection at the step may be prevented, so that reliability of the wiring is significantly improved and the yield of the semiconductor devices is improved.

When thermal oxidation is performed as in step (d'), the elements are indirectly contacted with the first insulating film such as the CVD SiO₂ film of the field region through the thermal oxide film at the part surrounding the element forming region. Therefore, the characteristics of the elements on the element forming region are not subjected to be influenced by the relatively unstable electric characteristics of the CVD SiO₂ film or the like. Moreover, the leakage current in the diffusion layer in the reverse direction may be prevented. Furthermore, in the thermal oxidation step, the plasma CVD SiO₂ film in the recess is annealed, and the property of the film is improved, and the interface between the plasma CVD SiO₂ film and the silicon substrate is partially thermally oxidized, so that the interface characteristics are improved.

In the etching step for forming the recess in the semiconductor substrate, the silicon substrate around the element forming region becomes pointed to have a cross section involving corners of about 90°. However, these corners can be rounded by oxidation in step (d'). Therefore, the concentration of the electric field at this corner is prevented, and the dielectric strength of an oxide film to be formed in a subsequent step could be improved.

DETAILED DESCRIPTION OF THE PREFERRED EMBODIMENTS

The method of the present invention as applied to the manufacture of a MOS semiconductor device will be described by way of examples with reference to the accompanying drawings.

EXAMPLE 1

Figure 1:
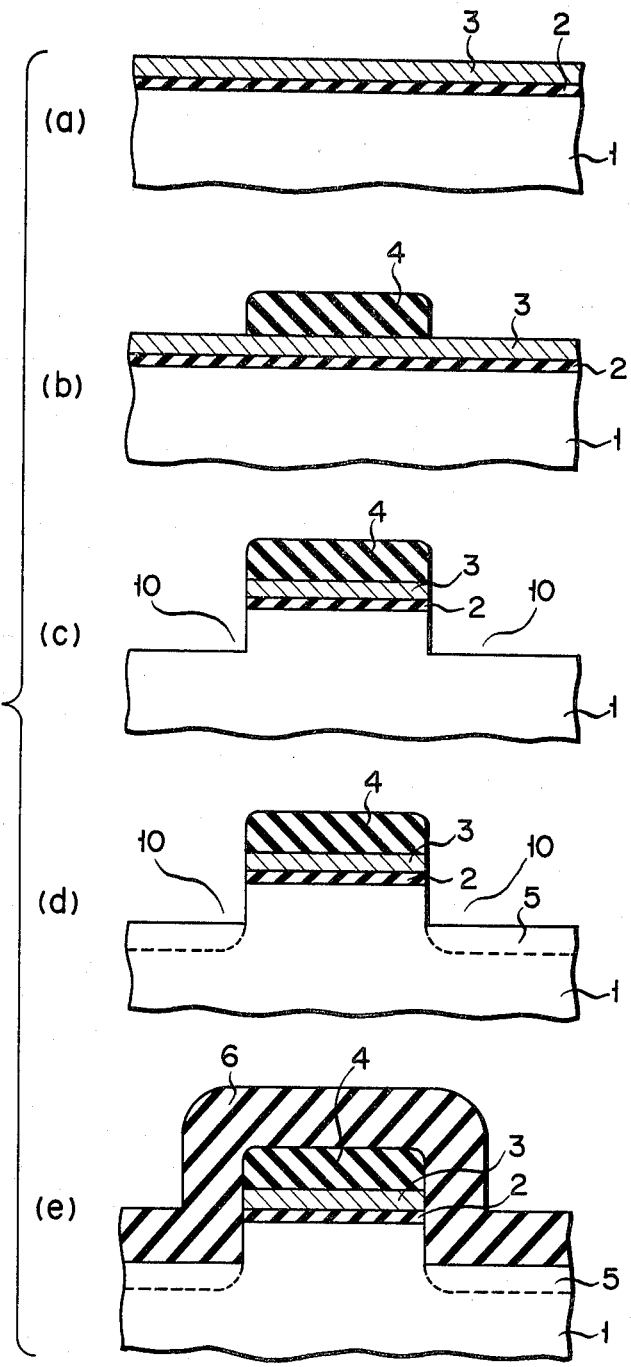
FIGS. 1a and 1i are sectional views showing an embodiment of the present invention in sequential order.

As shown in FIG. 1a, a p-type silicon substrate 1 is prepared which has an index of a plane of (100) and a specific resistivity of 5 to 50 Ω-cm. On the surface of the silicon substrate 1 are sequentially formed a thermal oxide film 2 of about 300 Å thickness and an aluminum film 3 of about 0.5 μm thickness. Next as shown in FIG. 1b, the element forming region is covered by a resist film 4 by the conventional lithographic process. As shown in FIG. 1c, the aluminum film 3 and the thermal oxide film 2 on the field region are etched by, for example, reactive ion etching using the resist film 4 as a mask. The field region is further etched by about 0.8 μm by reactive ion etching using an inert gas such as CF₄ gas and using resist film 4 and the aluminum film 3 as a mask to form a recess 10. Then, as shown in FIG. 1d, field ion-implantation is performed in the field region of the silicon substrate using the resist film 4 and the aluminum film 3 as a mask to form an inversion preventive layer 5. The resist film 4 may be removed prior to the step of ion-implantation. In the next step, as shown in FIG. 1e, a silicon oxide film (SiO₂) 6 is formed by the CVD process to a thickness of about 1.2 μm as a first insulating film on the entire surface of the structure. The presence of the resist film 4 is not necessarily required in this step. Thereafter, the entire surface of the silicon oxide film 6 is etched by ammonium fluoride. During this etching, the etching rate of the silicon oxide film at the side surface of the step portion is about 20 times that at the flat portion. For this reason, the vertical portion of the silicon oxide film 6 is removed from the recess 10 of the field region and the element forming region as shown in FIG. 1f, defining a V-shaped groove 7 around the recess 10. When the entire structure is subjected to treatment with a mixture of sulfuric acid and hydrogen peroxide, the aluminum film 3 used as a mask is removed. Simultaneously with this, the silicon oxide film 6 on these films 3 and 4 is removed, and the silicon oxide film 6 remains in the recess 10 over substrate 1 as shown in FIG. 1g. Next, as shown in FIG. 1h, a CVD silicon oxide film 8 is formed to a uniform thickness of 1.0 μm as a second insulating film to completely fill the V-shaped groove 7. A resist film 9 is applied thereover as a fluid film to make the surface flat. The entire surface of the structure is then etched by reactive ion etching. By suitably selecting the conditions for reactive ion etching and the time and temperature for annealing of the resist film 9, the etching rates of the resist film 9 and the CVD silicon oxide film 8 can be made to be substantially the same. Reactive ion etching is performed under selected conditions, and the resist film 9 is completely etched off. The CVD silicon oxide film 8 is etched until the semiconductor substrate on the element forming region is exposed. Then, as show in FIG. 1i, the CVD silicon oxide film 8 and the silicon oxide film 6 may be filled in the field region to achieve a flat structure. The remaining steps are performed according to the conventional element forming steps to complete a MOS semiconductor device.

In the example described above, the aluminum film and the resist film are used as the etching masks for forming the field region. However, by suitably selecting the etching method, the resist film may be removed after etching the aluminum film before proceeding to the process shown in FIG. 1c. Alternatively, the aluminum film need not be formed at all, and the resist film alone may be used as a mask.

EXAMPLE 2

Figure 2:
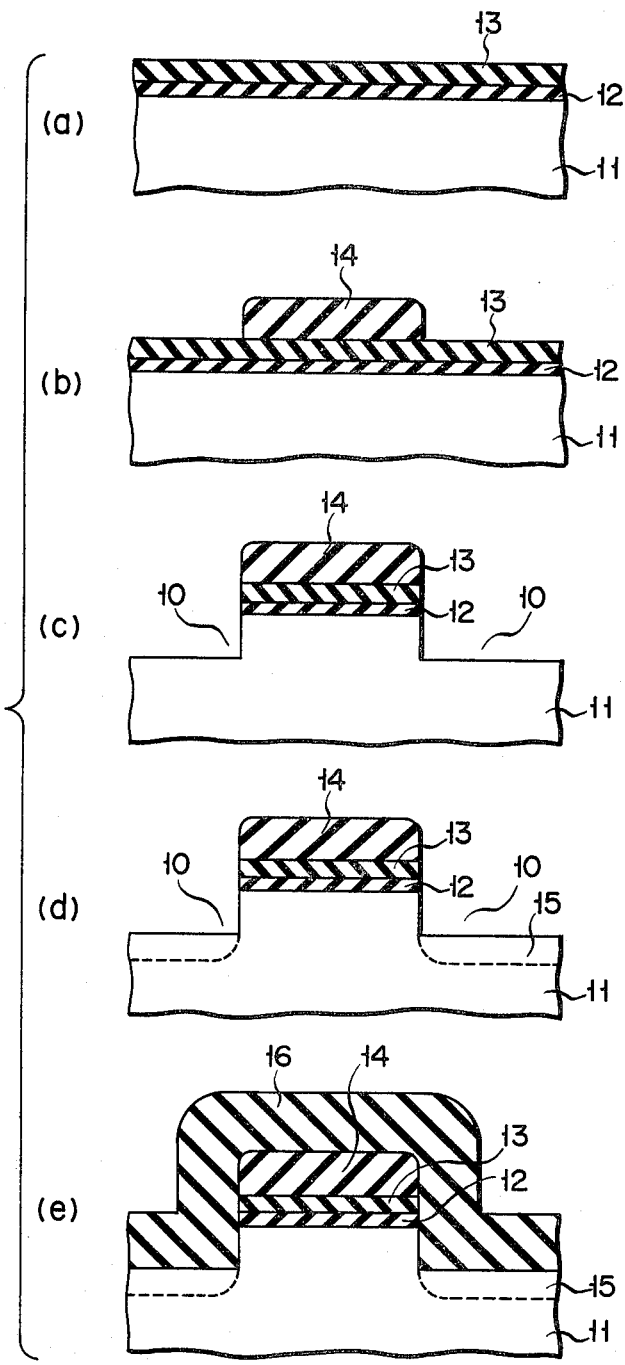
FIGS. 2a to 2h are sectional views showing another embodiment of the present invention in sequential order.
Figure 2:
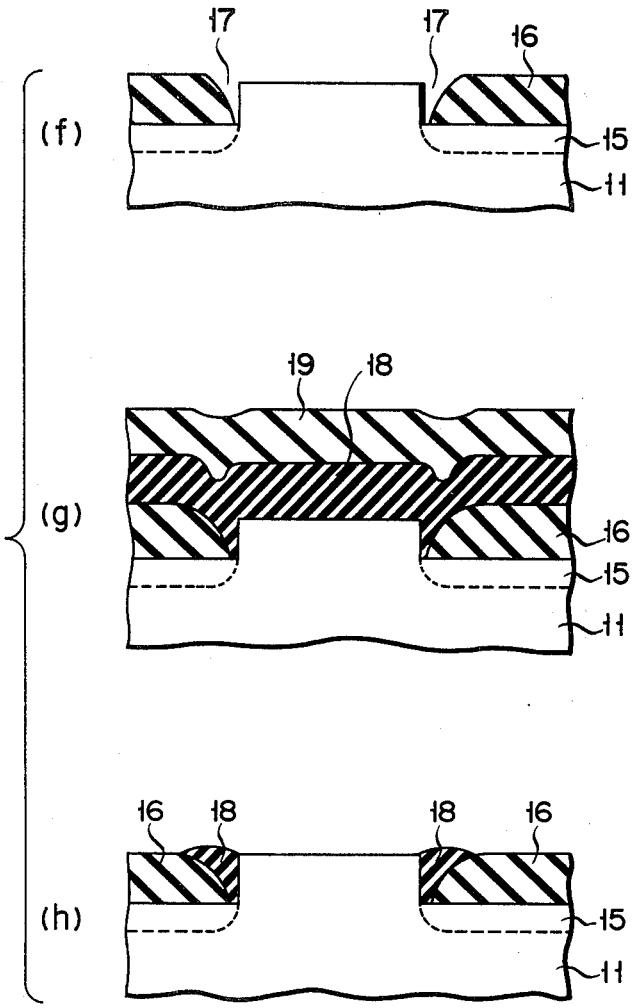

As shown in FIG. 2a, a p-type silicon substrate 11 is prepared which has a specific resistivity of 5 to 50 Ω-cm. On the surface of the silicon substrate 11 are sequentially formed a thermal oxide film 12 of about 300 Å and a phosphosilicate glass (PSG) film 13 of about 0.5 μm. Then, as shown in FIg. 2b, a resist film 14 is formed on the element forming region by the conventional lithographic process. Using the resist film 14 as a mask, parts of the PSG film 13, the thermal oxide film 12 and the semiconductor substrate 11 are etched, for example, by reactive ion etching to form the recess 10 as shown in FIg. 2c. Then, as shown in FIG. 2d, an inversion preventive layer 15 is formed in the field region by field ion-implantation. Thereafter, as shown in FIG. 2e, a silicon oxide film 16 is formed as a first insulating film on the surface of the semiconductor surface, for example, by the CVD process to a thickness greater than that of the step portion of the recess 10. The silicon oxide film is etched by ammonium fluoride solution. During this etching, the etching rate of the silicon oxide film 16 at the side surface of the step portion is about 20 times that at the other portions and is sufficiently greater than that of the PSG film 13. Therefore, the silicon oxide film 16 on the element forming region is removed faster than the silicon oxide film 16 on the field region. When the thermal oxide film 12 is further removed, as shown in FIG. 2f, a V-shaped groove 17 is formed around the element forming region, and the silicon oxide film 16 is left only at the field region. Thereafter, in the same manner as in Example 1, a CVD silicon oxide film 18 and a resist film 19 are deposited (FIG. 2g). These films 18 and 19 are uniformly etched to expose the surface of the substrate at the element forming region (FIG. 2h). As mentioned above, the resist film 14 may be removed before proceeding to the step shown in FIg. 2e.

In Examples 1 and 2 described above, the recess is completely filled with a CVD silicon oxide film and a resist film is applied to flaten the surface of the structure. Thereafter, the second insulating film consisting of the CVD silicon oxide film and the resist film is etched under the condition that the etching rates of the CVD silicon oxide film and the resist film are substantially the same. In this manner, the CVD silicon oxide film is left only in the V-shaped groove. However, it is also possible to form as a second insulating film a multilayer of a CVD silicon oxide film and a CVD silicon nitride film. In this case, the V-shaped groove is filled with this second insulating film in the manner to be described below. First, a CVD silicon oxide film is formed to a uniform thickness of about 1.0 μm to fill the V-shaped groove. Next, by the plasma CVD process or the general CVD process, a CVD silicon nitride film of about 1.0 μm is formed. Thereafter, the silicon nitride film is etched by reactive ion etching using a mixture of CF₄ and H₂. When the mixing ratio of hydrogen gas is great, the etching rate of the silicon nitride film at the flat part becomes sufficiently great in comparison with that at the step portion, so that the surface of the silicon nitride film is flattened. Thereafter, etching is performed under such conditions that the etching rates of the silicon nitride film and the silicon oxide film are the same to form the silicon oxide film uniformly and evenly on the field region.

EXAMPLE 3

Figure 3:
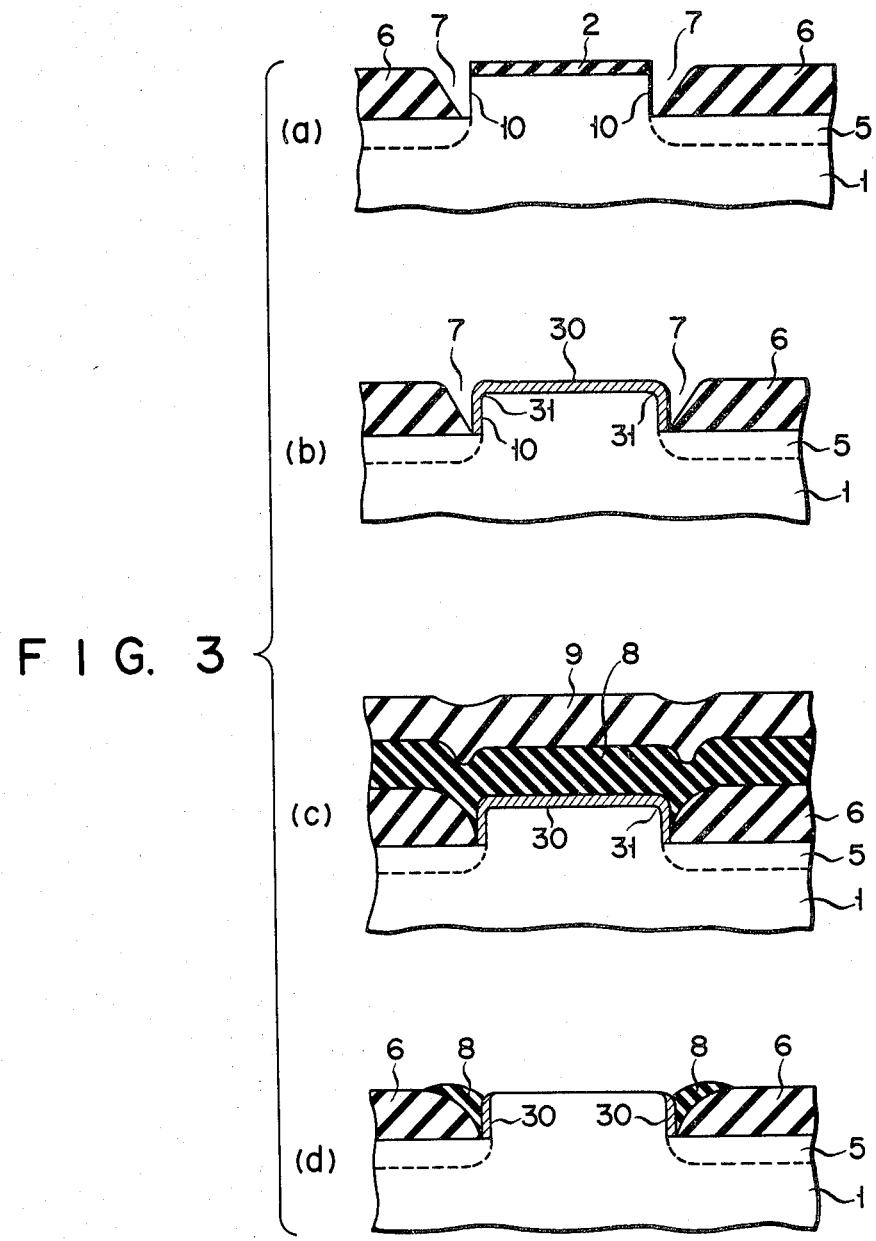
FIGS. 3a to 3d are sectional views showing still another embodiment of the present invention.

In the same manner as in Example 1, the silicon oxide film 6 is formed in the recess formed in the p-type silicon substrate 1 to obtain a structure as shown in FIG. 1g (FIG. 3a). The reference numerals indicated in FIG. 3d denote the same parts as in FIG. 1g except as otherwise indicated.

Next, the thermal oxide film 2 is removed. Thereafter, annealing is performed in an oxygen atmosphere at 1,000° C. to form a thermal oxide film 30 of about 500 Å on the exposed surface of the substrate (FIG. 3b). During this annealing, the silicon film 6 is also annealed, so that the characteristics of the interface between the silicon oxide film 6 and the semiconductor substrate are improved as well as the characteristics of the silicon oxide film 6 itself. Simultaneously, shoulders 31 of the recess 10 around the element forming region are sufficiently rounded, so that the dielectric breakdown at this part, of a gate oxide film to be formed later due to concentration of the electric field, is reduced.

In this Example 3, the thermal oxide film 2 is removed before forming the thermal oxide film 30. However, it is also possible to proceed immediately to a step of forming the thermal oxide film 30 without removing the thermal oxide film 2, to obtain almost the same results as described in Example 3.

Next as shown in FIG. 3c, as a second insulation film, the CVD silicon oxide film 8 is formed to a uniform thickness of 1.0 μm to completely fill the V-shaped groove 7. The resist film 9 is formed thereover to flatten the surface of the structure. The entire surface is subjected to etching to expose the surface portion of the semiconductor substrate in the element forming region. In this step, as shown in FIG. 3d, a field region filled with the films 8 and 9 in a flat structure may be formed. Thereafter, the general element forming steps are performed to complete a MOS semiconductor device.

The present invention is not limited to the method for manufacturing a MOS semiconductor device and may be applied to element isolation of a bipolar semiconductor device or of a complementary MOS semiconductor device. When SOS (Silicon-On-Sapphire) in which a silicon layer is grown on a saphire substrate is employed as a semiconductor substrate, a portion of the silicon layer falling in a field region should be completely etched off to form a recess, and then steps of filling in the recess of an insulating material can be performed according to the present invention.

What we claim is:

1. A method for manufacturing a semiconductor device comprising the steps of:
   (a) forming a masking material at a predetermined part of a surface of a semiconductor substrate, and etching said semiconductor substrate using said masking material as a mask to form a recess;
   (b) applying under low pressure conditions a first insulating film on the surface of said semiconductor substrate having said masking material still disposed thereon, said first insulating film being such that the side surfaces of step portions of said recess are etched at a greater rate than other surfaces thereof;
   (c) etching said first insulating film to selectively remove said first insulating film covering the side surface of said recess to thereby reproducibly form a V-shaped groove between the side surface of said recess and said first insulating film remaining in said recess;
   (d) simultaneously removing said masking material and said first insulating film formed thereover;
   (e) forming a second insulating film on an upper surface of said semiconductor substrate including said V-shaped groove formed in said step (c) in such a way to form a smooth upper surface thereof; and
   (f) etching the upper surface of said second insulating film to leave said first and second insulating films in said recess.

2. The method according to claim 1, wherein said second insulating film comprises a plurality of insulating films.

3. The method according to claim 1, wherein said first insulating film is made of a member selected from the group consisting of plasma CVD $SiO_2$, plasma CVD $Si_3N_4$, sputtered $SiO_2$, and low-pressure CVD phosphosilicate glass.

4. The method according to claim 1, wherein a thermal oxide film is formed on the surface of said semiconductor substrate before said step (a).

5. The method according to claim 1, further comprising the step of implanting an impurity for formation of a channel stopper below said recess.

6. The method according to any one of claims 1 to 5, wherein, after said step (d) and before said step (e), a thermal oxide film is formed on the exposed surface of said semiconductor substrate at least in the inner surface of said V-shaped groove.

* * * * *